(12) United States Patent
Chen et al.

(10) Patent No.: US 9,435,863 B2
(45) Date of Patent: Sep. 6, 2016

(54) INTEGRATED CIRCUIT TESTING INTERFACE ON AUTOMATIC TEST EQUIPMENT

(71) Applicant: Sitronix Technology Corp., Hsinchu County (TW)

(72) Inventors: Chun-Chi Chen, Hsinchu County (TW); Hung-Wei Lai, Hsinchu County (TW); Tsung-Jun Lee, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 87 days.

(21) Appl. No.: 14/492,067

(22) Filed: Sep. 21, 2014

(65) Prior Publication Data

US 2015/0212155 A1 Jul. 30, 2015

Related U.S. Application Data

(60) Provisional application No. 61/930,970, filed on Jan. 24, 2014.

(30) Foreign Application Priority Data

Jun. 6, 2014 (TW) .............................. 103119788 A

(51) Int. Cl.
  *G01R 31/28* (2006.01)
  *G01R 31/319* (2006.01)
(52) U.S. Cl.
  CPC ... *G01R 31/31908* (2013.01); *G01R 31/31905* (2013.01)

(58) Field of Classification Search
  CPC .................. G01R 31/31908; G01R 31/31905
  See application file for complete search history.

(56) References Cited

U.S. PATENT DOCUMENTS

| 2004/0059971 A1* | 3/2004 | Cowan | ............... G01R 31/2834 |
| | | | 714/724 |
| 2007/0162800 A1* | 7/2007 | Tanaka | ............... G01R 31/2831 |
| | | | 714/724 |

FOREIGN PATENT DOCUMENTS

| KR | 1020070053719 A | 5/2007 |
| KR | 1020100016139 A | 2/2010 |
| TW | M488641 U | 10/2014 |
| WO | 2008119179 A1 | 10/2008 |

* cited by examiner

*Primary Examiner* — Thien D Nguyen
(74) *Attorney, Agent, or Firm* — Winston Hsu; Scott Margo

(57) ABSTRACT

An integrated circuit (IC) testing interface capable of upgrading an automatic test equipment (ATE) for testing a semiconductor device includes at least one pin for receiving or transmitting at least a test signal to a tester of the automatic test equipment, a plurality of digitizers coupled to the at least one pin for generating a digital signal, a processing means coupled to the plurality of digitizers for processing the digital signal, and a connection unit for connecting the processing means with a computing device for transmitting an output signal from the processing means to the computing device, where the IC testing interface is disposed between the tester and a prober of the automatic test equipment.

16 Claims, 15 Drawing Sheets

INTEGRATED CIRCUIT TESTING INTERFACE ON AUTOMATIC TEST EQUIPMENT

CROSS REFERENCE TO RELATED APPLICATIONS

This application claims the benefit of U.S. Provisional Application No. 61/930,970, filed on Jan. 24, 2014 and entitled "Low-Cost Digitizers and DSP for LCD Driver Testing on Automatic Test Equipment", the contents of which are incorporated herein in their entirety.

BACKGROUND OF THE INVENTION

1. Field of the Invention

The present invention relates to an integrated circuit (IC) testing interface, and more particularly, to an IC testing interface capable of upgrading an automatic test equipment (ATE) for testing a semiconductor device.

2. Description of the Prior Art

Since the Liquid Crystal Display (LCD) price is going lower and the quality is improving, the LCD has been broadly used in IT products such as personal computers, notebooks, personal digital assistants (PDAs), mobile phones, televisions, and watches.

The LCD primarily includes one or more source drivers (column drivers), one or more gate drivers (row drivers), and a panel, wherein the characteristic response between input voltage and transmittance-voltage of the liquid crystal is nonlinear. FIG. 1 shows the conventional output voltage characteristic of an LCD. In the conventional application of LCD, the internal reference voltages VL0-VL6, VH0-VH6, having positive and negative polarities in a decreasing order (or in an increasing order from negative to positive polarity), are corresponding to the output voltage curve (gamma curve) generated from the input data. Therefore, the gamma correction in the digital to analog conversion circuit is required to compensate the nonlinear characteristic.

Since the source drivers are required to receive a plurality of external reference voltages to convert the input digital signals to corresponding analog signals and output the correct voltage to data line so as to drive the pixels of the LCD panel for display, the primary function of an LCD driver IC is a digital to analog conversion. Therefore, the conventional techniques utilize the digitizer of a tester or a test board to test the LCD IC.

The industry has always been chasing after better performance of the integrated circuits and faster testing speed. In the era with booming electronic industry, the technology of integrated circuits is improving day by day. To comply with the high frequency circuit demand as well as the high complexity architecture, the life-cycle for automatic test equipment is going shorter than before, e.g. 5 years. The function specifications of legacy ATE, such as Teradyne J750, SC312, Yokogawa TS6700, merely comply with the LCD driver IC of monochrome LCD rather than colored LCD. Therefore, those old test equipments are mostly phased out.

With the price of IC chip going down, the cost of integrated circuit test should be minimized as well. The primary cost of integrated circuit test comes from consumption and upgrade of Automatic Test Equipments (ATE). However, if the life-cycle of the automatic testing equipment is about or even less than 5 years, the cost of the integrated circuit test is not possible to be reduced.

Therefore, how to develop low-cost automatic testing equipment for reducing the IC price is a topic to be addressed and discussed.

SUMMARY OF THE INVENTION

An objective of the present invention is to provide a low-cost IC testing interface which can be utilized in an existing ATE for upgrading the testing performance of the ATE, thereby reducing IC testing cost.

The present invention discloses an integrated circuit (IC) testing interface capable of upgrading an automatic test equipment (ATE) for testing a semiconductor device. The IC testing interface includes at least one pin, configured for receiving or transmitting at least one test signal to a tester of the automatic test equipment; a plurality of digitizers, coupled to the at least one pin for generating a digital signal; a processing means, coupled to the plurality of digitizers for processing the digital signal; and a connection unit, configured for connecting the processing means with a computing device for transmitting an output signal from the processing means to the computing device; where the IC testing interface is disposed between the tester and a prober of the automatic test equipment.

The present invention further discloses an automatic test equipment (ATE) for testing a semiconductor device. The ATE includes a tester; a prober, configured for carrying the semiconductor device; a probe card, coupled to the tester for probing the semiconductor device; and an integrated circuit (IC) testing interface, coupled to the tester and installed outside of the tester. The IC testing interface includes at least one pin, configured for receiving or transmitting at least one test signal to the tester; a plurality of digitizers, coupled to the at least one pin for generating a digital signal; a processing means, coupled to the plurality of digitizers for processing the digital signal; and a connection unit, configured for connecting the processing means with a computing device for transmitting an output signal from the processing means to the computing device; where the IC testing interface is disposed between the tester and the prober of the ATE.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
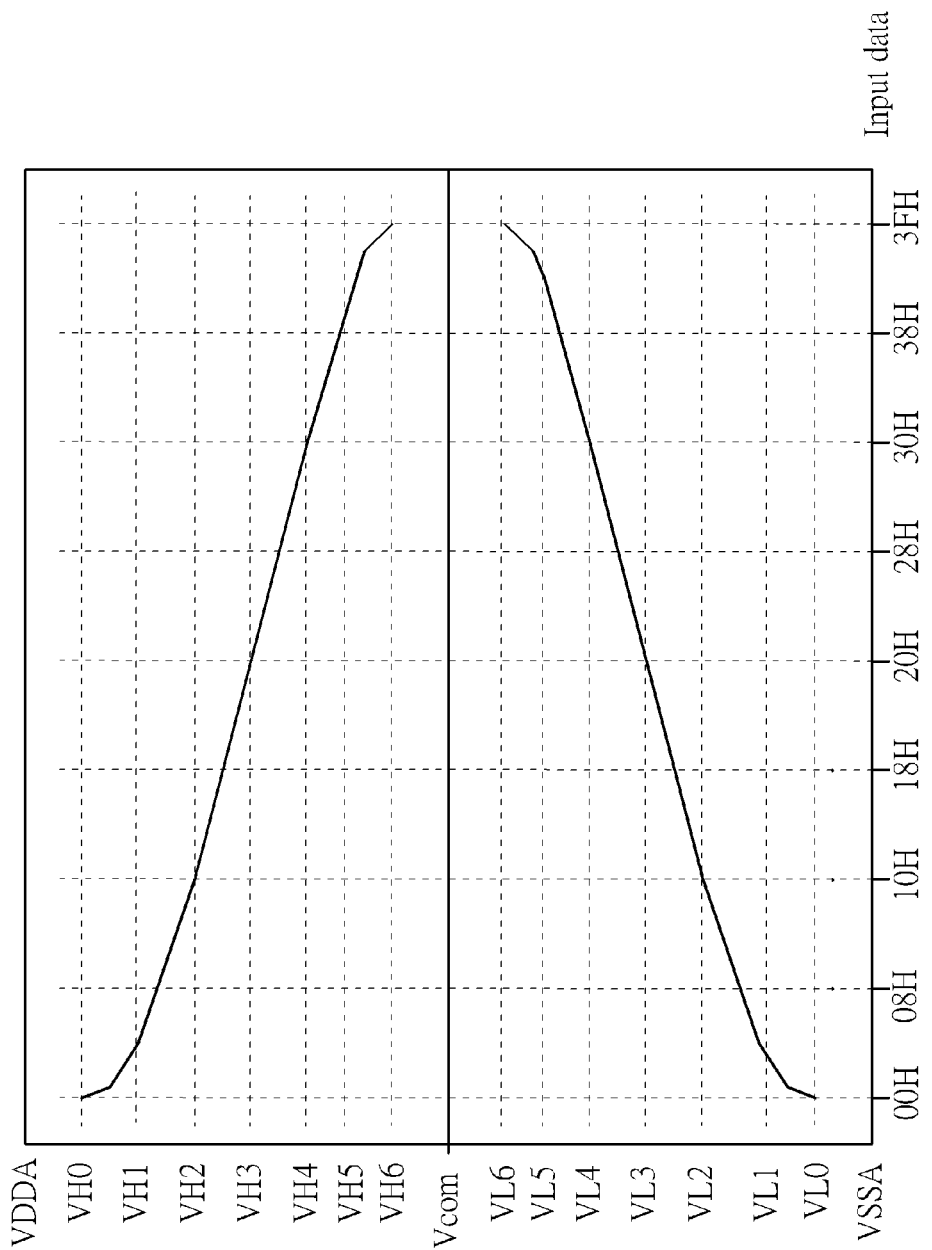
FIG. 1 shows the output voltage characteristics of a conventional LCD.
Figure 2:
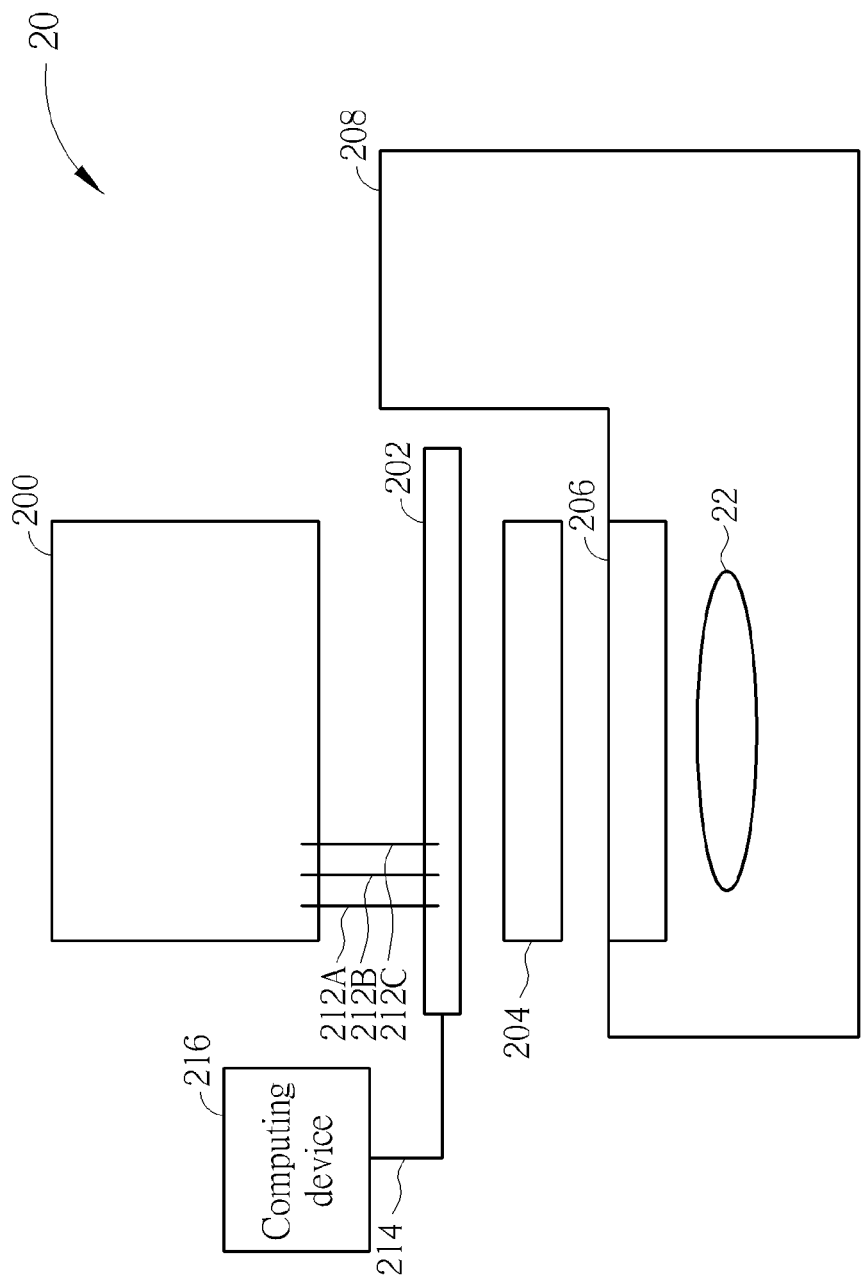
FIG. 2 is a schematic diagram of an automatic test equipment according to an example of the present invention.

FIG. 2 is a schematic diagram of an automatic test equipment (ATE) 20 according to an example of the present invention. The ATE 20 includes a tester 200, an integrated circuit testing interface 202, a probe tower 204, a probe card 206, a prober 208, and a computing device 216 for testing the functions, parameters, and the characteristics of a device under test (DUT) 22 (e.g. a wafer, a LCD driver IC). The tester 200, the probe tower 204, the probe card 206, the prober 208, and the computing device 216 of the ATE 20 may be the equipments of a legacy ATE (e.g. Teradyne J750, SC312, Yokogawa TS6700, etc.). The integrated circuit testing interface 202 may integrate a probe interface board, a load board, or a probe board, and may be disposed on between the tester 200 of an ATE 20 and the prober 208. The integrated circuit testing interface 202 is installed in the ATE 20.

The integrated circuit testing interface 202 is preferably a replaceable interface. It includes pins 212A-212C, a plurality of digitizers, a processing means, and a connector 214. The integrated circuit testing interface 202 receives or transmits the test signals to the tester 200 via the pins 212A-212C for converting the analog test signals of the LCD driver IC to the digital signals. The integrated circuit testing interface 202 further includes one or more processing means that coupled to a plurality of digitizers for the digital signal processing. The signals processed by digitizers and processing means of the integrated circuit testing interface 202 may transmit an output signal to the computing device 216 via the connector 214, for storing, determining, and analyzing the following up procedures according to the testing results. Since the tester 200, the probe tower 204, the probe card 206, the prober 208, and the computing device 216 of the ATE 20 may be reused from the original components of a legacy ATE, it only requires to adopt the proper integrated circuit testing interface 202 and configure the digitizers and the processing means while upgrading the legacy ATE for testing different specifications or higher specification DUT 22. The cost of the integrated circuit test is significantly reduced, and the competitiveness is increased because it is not required to purchase a new ATE.

Figure 3:
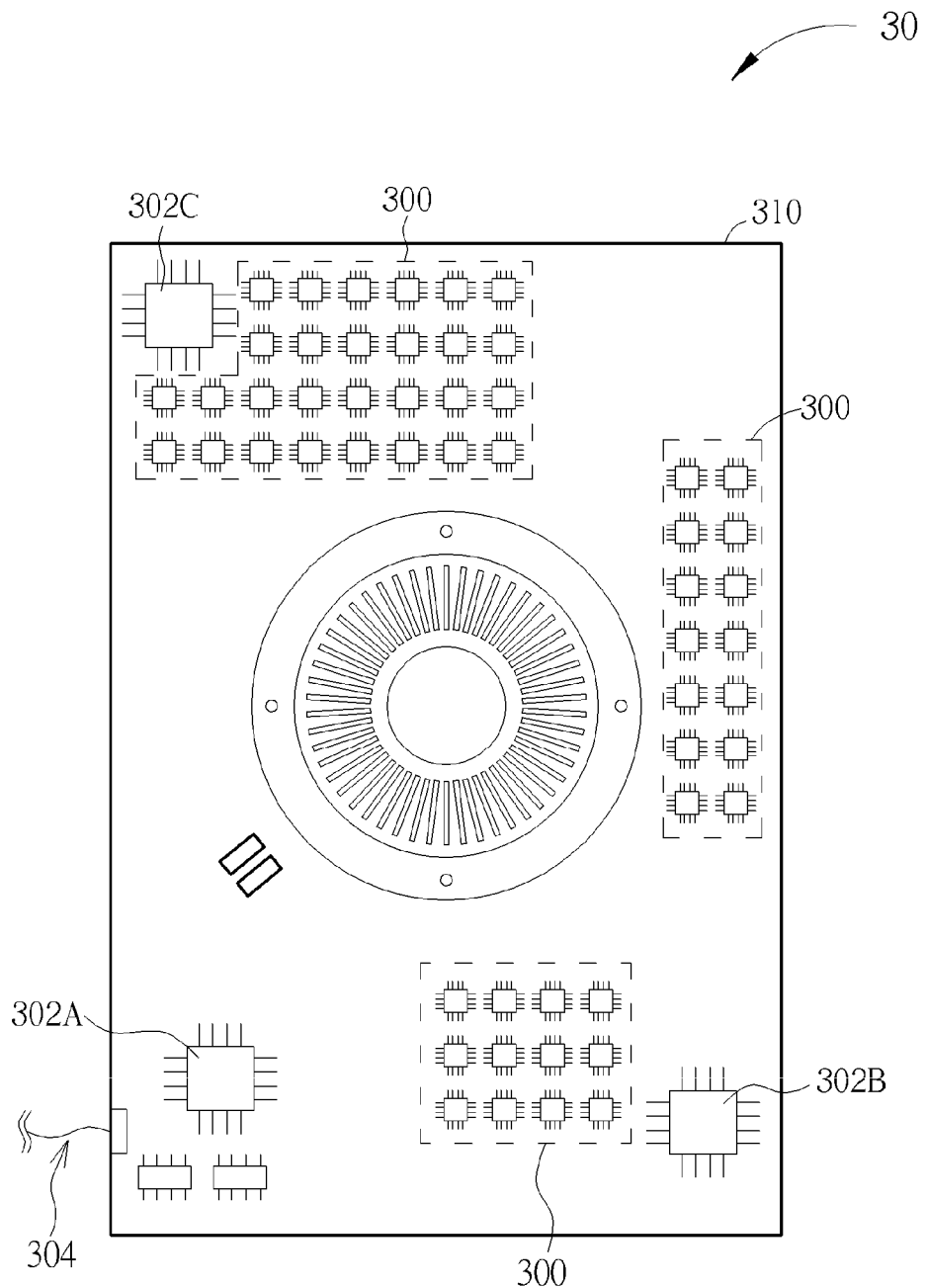
FIG. 3 is a schematic diagram of an integrated circuit testing interface according to an example of the present invention.

Referring FIG. 3, the integrated circuit testing interface 30 integrates the load board 30 and connects to the ATE, such as Yokogawa TS6700, for connecting between the integrated circuit testing interface 202 and the ATE shown in FIG. 2. As indicated in FIG. 3, the digitizer 300 and the processing means 302A, 302B, 302C are disposed on boarder area of the load board 310 so that it will not affect the function of the load board 310. The test signals processed by the digitizer 300 and the processing means 302A, 302B, 302C may transmit the output signals regarding the test data to the computing device 216 (shown in FIG. 2) of the ATE 20 via the connector 304. The connector 304 may include a (Universal Serial Bus USB) or others like IEEE 1394 serial bus for transmitting the test data to the computing device 216.

Figure 4:
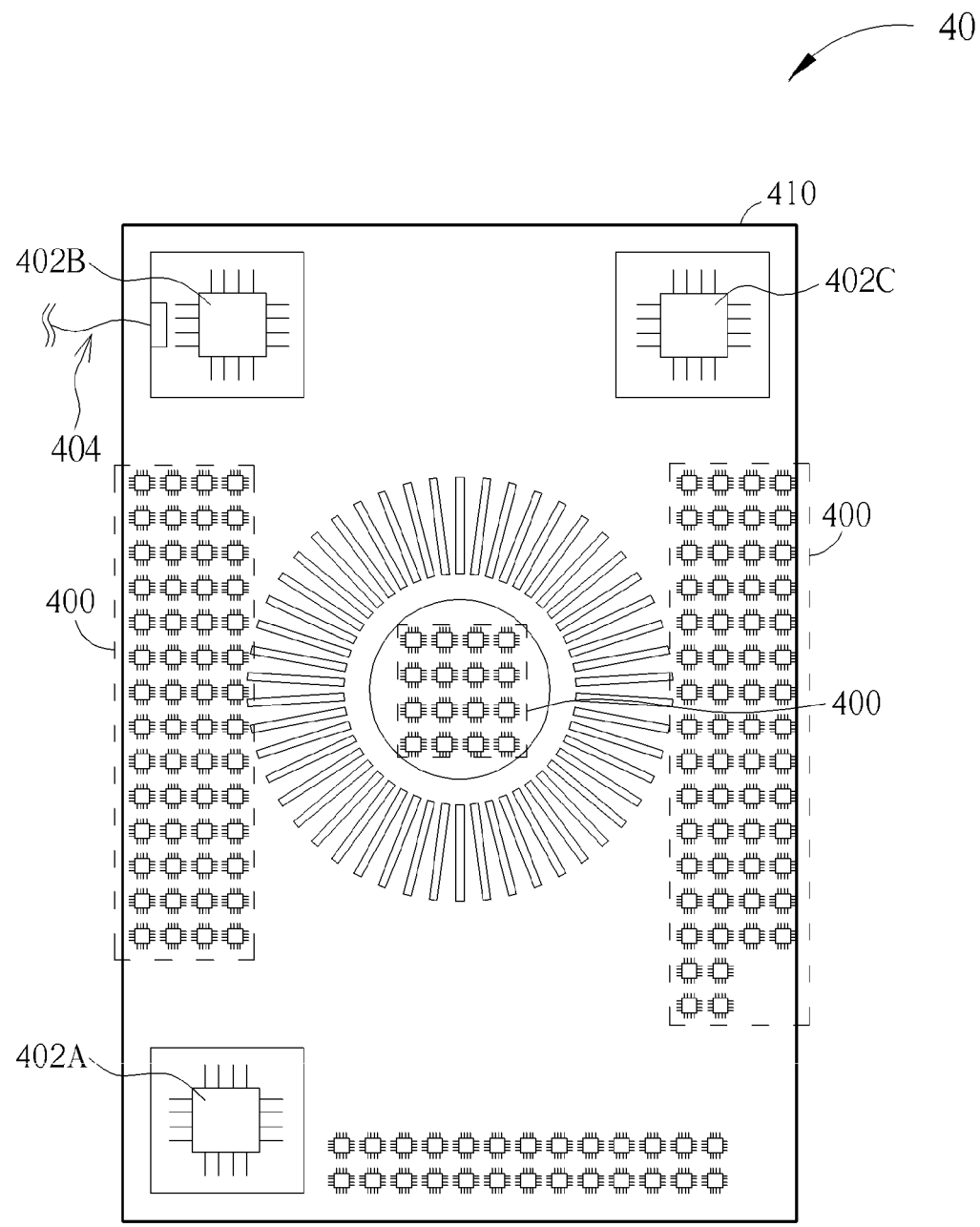
FIG. 4 is a schematic diagram of an integrated circuit testing interface according to another example of the present invention.

FIG. 4 shows a diagram of an integrated circuit testing interface 40 according to another embodiment of the present invention. The integrated circuit testing interface 40 integrates the probe interface board 410 and is connected to the ATE such as Teradyne J750 for realizing the connection between the integrated circuit testing interface 202 and the ATE shown in FIG. 2. As shown in FIG. 4, the digitizer 400 and the processing means 402A, 402B, 402C are disposed on central and boarder area of the probe interface board 410 so that it will not affect the function of the probe interface board 410. The test signals processed by the digitizer 400 and the processing means 402A, 402B, and 402C may transmit the output signals regarding the test data to the computing device 216 (shown in FIG. 2) of the ATE 20 via the connector 404. Similar to the integrated circuit testing interface 30, the connector 404 may include a USB or others like IEEE 1394 serial bus for transmitting the test data to the computing device 216.

Figure 5:
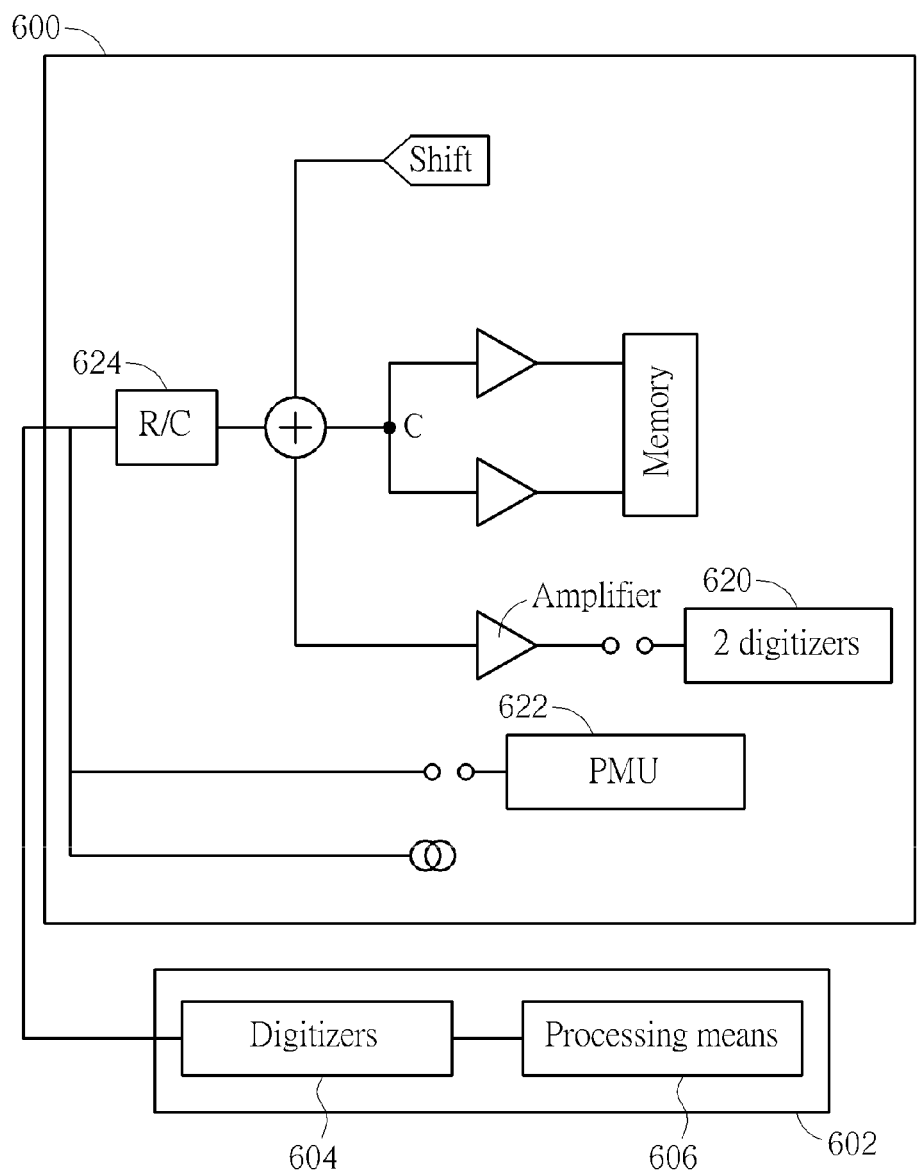
FIG. 5 illustrates the pin electronic between a tester and an integrated circuit testing interface according to an example of the present invention.

In some embodiments, the testers of some ATE, such as Yokogawa TS6700, have dedicated LCD channels. In such a situation, the integrated circuit testing interface of the present invention may be directly connected to the dedicated LCD channels of the tester by utilizing its parametric measurement unit (PMU). FIG. 5 shows a diagram of the LCD channels 600 of a tester and the pin electronic of an integrated circuit testing interface 602. The LCD channel 600 may be the dedicated LCD channel of the tester 200 shown in FIG. 2. The integrated circuit testing interface 602 may be the integrated circuit testing interface 202 shown in FIG. 2 (or the integrated circuit testing interface 30 shown in FIG. 3). The plurality of the digitizers 604 may be the digitizers 300 indicated in FIG. 3. The processing means 606 may be the processing means 302A, 302B, 302C shown in FIG. 3. The LCD channel 600, including two digitizers 620, is used to test the source driver of the LCD. The plurality of the digitizers 604 of the integrated circuit testing interface 602 is coupled to the LCD channel 600, wherein the connecting point is located between the parametric measurement unit 622 of the LCD channel 600 and the ranging circuit (R/C) 624. In addition, a switch may be used to determine whether to utilize the parametric measurement unit 622 for the testing in order to comply with certain measurement requirements.

Figure 6:
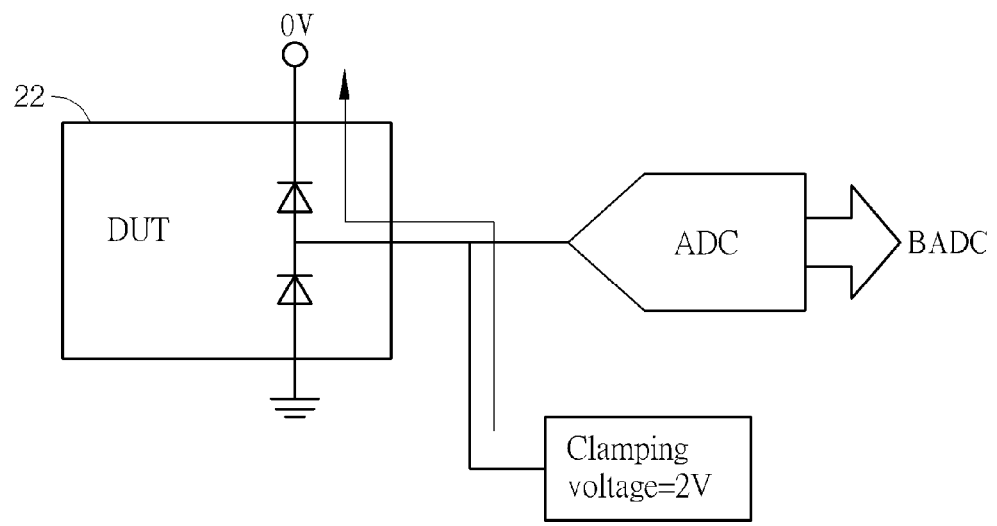
FIG. 6 shows a current flow between an integrated circuit testing interface and a device under test (DUT) according to an example of the present invention.
Figure 6:
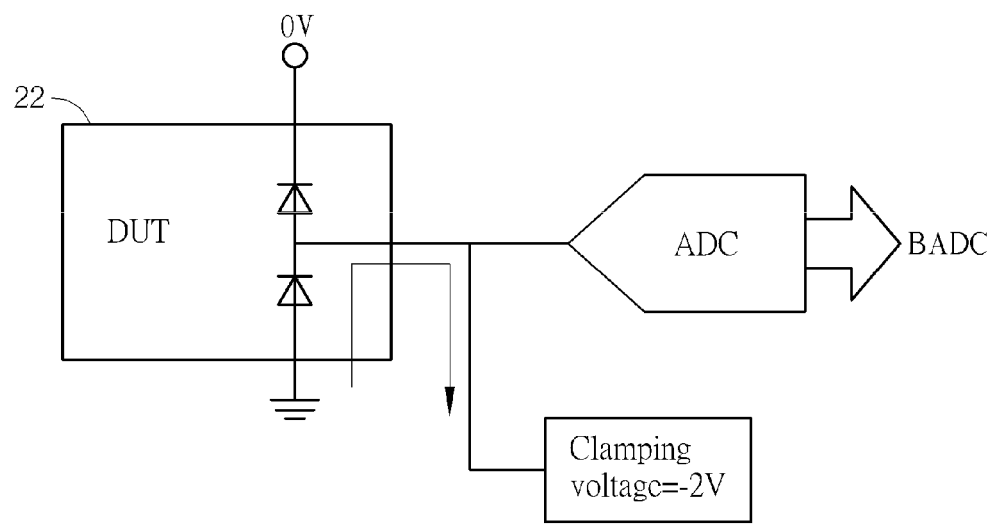

In some embodiments, the legacy ATE (e.g. Teradyne J750) does not have the dedicated LCD channel. In such a condition, the digitizer of the integrated circuit testing interface may be connected to the general LCD channels of the legacy ATE as shown in FIG. 6. As a result, when the ATE proceed with open/short test, the PMU of the tester may clamp the output pin of the DUT 22 within +/−2V (i.e. utilize the general LCD channel to provide the clamping voltage 2V or −2V), such that the current would flow to the diode of the DUT 22, and the analog-to-digital converter (ADC) may acquire the output data of the DUT 22.

Noticeably, the above embodiments illustrate that a plurality of digitizers (or ADCs) may be coupled to the PMU of the dedicated LCD channel or may be connected to the PMU of the general LCD channel. The scope of the present invention is not limited therein. In some embodiments, two PMUs may be provided for generating the clamping voltage +2V an −2V in addition to the LCD channel or the tester. The PMUs may be coupled to a plurality of digitizers for providing additional test signal paths and increasing the testing efficiency. The additionally provided PMUs may be integrated onto the probe interface board, the load board or the probe board, or the other equipment that is near the tester.

Figure 7:
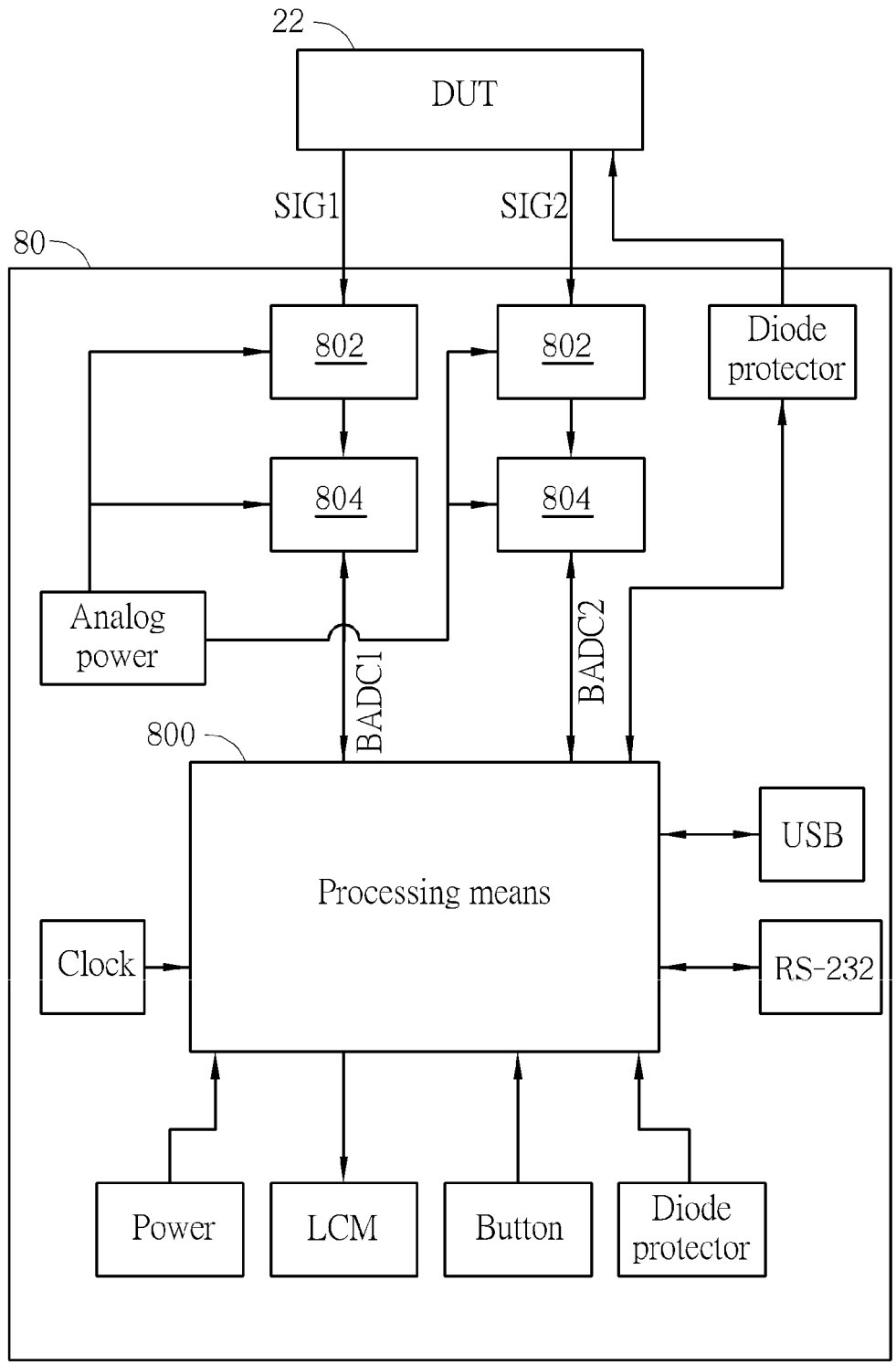
FIG. 7 is a system block diagram of an integrated circuit testing equipment according to an example of the present invention.

FIG. 7 is a system block diagram of an integrated circuit testing interface 80 according to an example of the present invention. The integrated circuit testing interface 80 may be used to realize the integrated circuit testing interface 202 shown in FIG. 2 or the integrated circuit testing interface 30 shown in FIG. 3. In an integrated circuit testing interface 80, a digitizer at least includes an OPA (operational amplifier) 802 and an ADC (analog-to-digital converter) 804. The test signals SIG1, SIG2 may be directly fed into the integrated circuit testing interface 202 via the DUT 22, or the test signals SIG1, SIG2 may be obtained from the tester 200 of the FIG. 2. The processing means 800 is used for realizing the processing means 302A, 302B, 302C shown in FIG. 3. The processing means 800 may include one or more Field-programmable gate arrays (FPGAs), one or more Application-specific integrated circuit (ASICs), or one or more MPUs (Micro processing unit), but is not limited herein. The processing means 800 may collect or control the signals BADC1, BADC2 outputted from the ADC 804, and proceed with conversion, sorting, and calibration. The processing means may be coupled to one or more data transmission interfaces, such as RD-232 or USB, for connecting with the storage devices of the computing device 216 shown in FIG. 2.

For example, the present invention may utilize the legacy ATE Yokogawa TS6700 to test 736 LCD output channels. In this case, 92 8-multipexedADCs and 184 quad-OPAs (4 OPAs) may be utilized to realize the OPA 802 and the ADC 802 shown in FIG. 7. In addition, 112 digital pins, 736 LCD pin, the power supply, and the device control circuits (e.g. the button or the LCD module) may be defined on the load board.

In another embodiment, the present invention may utilize the legacy ATE Teradyne J750 to test 2208 LCD output channels. In this case, 138 8-multipexed ADCs and 276 quad-OPAs (4 OPAs) may be utilized to realize the OPA 802 and the ADC 802 shown in FIG. 7. If it is to comply with the specification of dual LCD output channels, an additional 276 quad-Single Pole Double Throw (quad-SPDTs) switch may be added to accomplish the integrated circuit testing interface for supporting 2208 LCD output channels.

Figure 8:
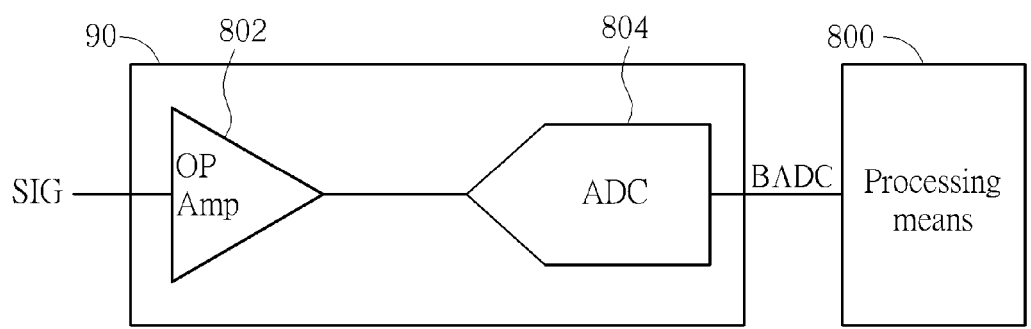
FIG. 8 depicts a schematic diagram for the output channel of a set of LCDs in the integrated circuit testing interface shown in FIG. 7.

To prevent from liquid crystal polarization, the source driver IC of the LCD requires a bipolar input range. FIG. 8 shows one of the LCD output channels of the integrated circuit testing interface 80 in FIG. 7, wherein the ADC 804 may adopt the synchronous serial data protocol of Serial Peripheral Interface (SPI). The SPI has four pins, defined by clock, data-in (DIN), data out (DOUT), and the chip select (CS), for reducing the package area of ADC 804 and simplifying the layout routing between the ADC 804 and the processing means 800. Note that the transmission protocol between the ADC 804 and the processing means 800 is not limited to SPI. For example, I²C (Inter-Integrated Circuit) or LVDS (Low-Voltage Differential Signaling) may be used as an interface protocol between the ADC 804 and the processing means 800.

The integrated circuit testing interface may include the 3.3V, 1.2V, and 2.5V regulators. The 3.3V regulator may be used as the I/O power of the processing means 800 and the digital power of the ADC 804; the 1.2V regulator may be used as the core power of the processing means 800; and the 2.5V regulator may be used as the power supply to the PLL (Phase Lock Loop) of the processing means 800.

After the test signal SIG is transmitted to the digitizer of the integrated circuit testing interface 90 for converting into the digital signal BADC, the processing means 800 (e.g. one or more FPGAs) may perform the digital signal processing to calibrate the test signal SIG. The calibration procedure includes the steps to determine the gain and the offset for every LCD output channels. In an embodiment, the calibration equation is described as below $$y = Mx + C \quad (1)$$

where c represents the offset, M is the scale factor multiplier, x is the pre-calibration data and y is the calibrated output data.

To reduce the zero offset error, the LCD PMU of the legacy ATE Yokogawa TS6700 may be adjusted to a minimum value, i.e., the input lower bound of a digitizer, measure the actual input binary codes, and then compare it to the ideal value, wherein the difference value is the zero offset error C. On the other hand, to reduce the gain error, the LCD PMU of the legacy ATE Yokogawa TS6700 may be adjusted to a maximum value, i.e., the input upper bound of a digitizer, and then compare it to the ideal value, wherein the difference value is the gain error. The scale factor multiplier, M, is therefore obtained.

Figure 9:
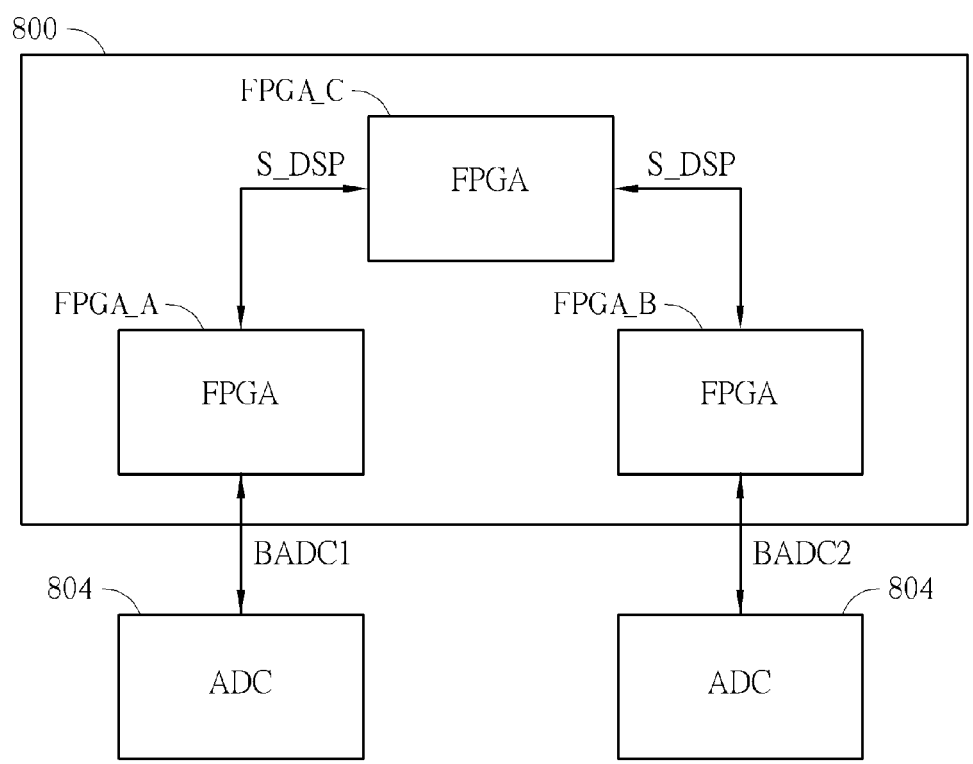
FIG. 9 shows a diagram of an implementation example of the processing means and the analog-to-digital converter (ADC) shown in FIG. 7.

The processing means of the integrated circuit testing interface may partition into more than one processing units for better management. In FIG. 9, the FPGAs (FPGA_A, FPGA_B, FPGA_C) may be used to realize the processing means 800 of the FIG. 7. The FPGA_A and FPGA_B are connected to two sets of ADCs 804, respectively, and the data processed by the FPGA_A and FPGA_B are transmitted to the FPGA_C for further computation.

The FPGA has to process the SPI (Serial Peripheral Interface) of the ADC 804, i.e. to configure the register of the ADC 804 for acquiring the serial data. For example, if utilizing 92 8-multiplexed ADCs and 184 quad-OPAs to test 736 LCD output channels, it means the SPI of the ADC 804 has 468 IO (Input output) units. In such a condition, the 8-bit data bus may be used for data transmission between the FPGA_C and FPGA_A, FPGA_B. The FPGA_A, FPGA_B may be connected to 46 8-multiplexed ADCs for processing the SPI of the ADC. The FPGA_A and FPGA_B may convert the serial data of ADC output to the parallel data, and then transmit the parallel data to FPGA_C for further computation. Next, FPGA_C may calibrate and compute the original data from the measurement to obtain a test result (e.g. test pass or fail).

Figure 10:
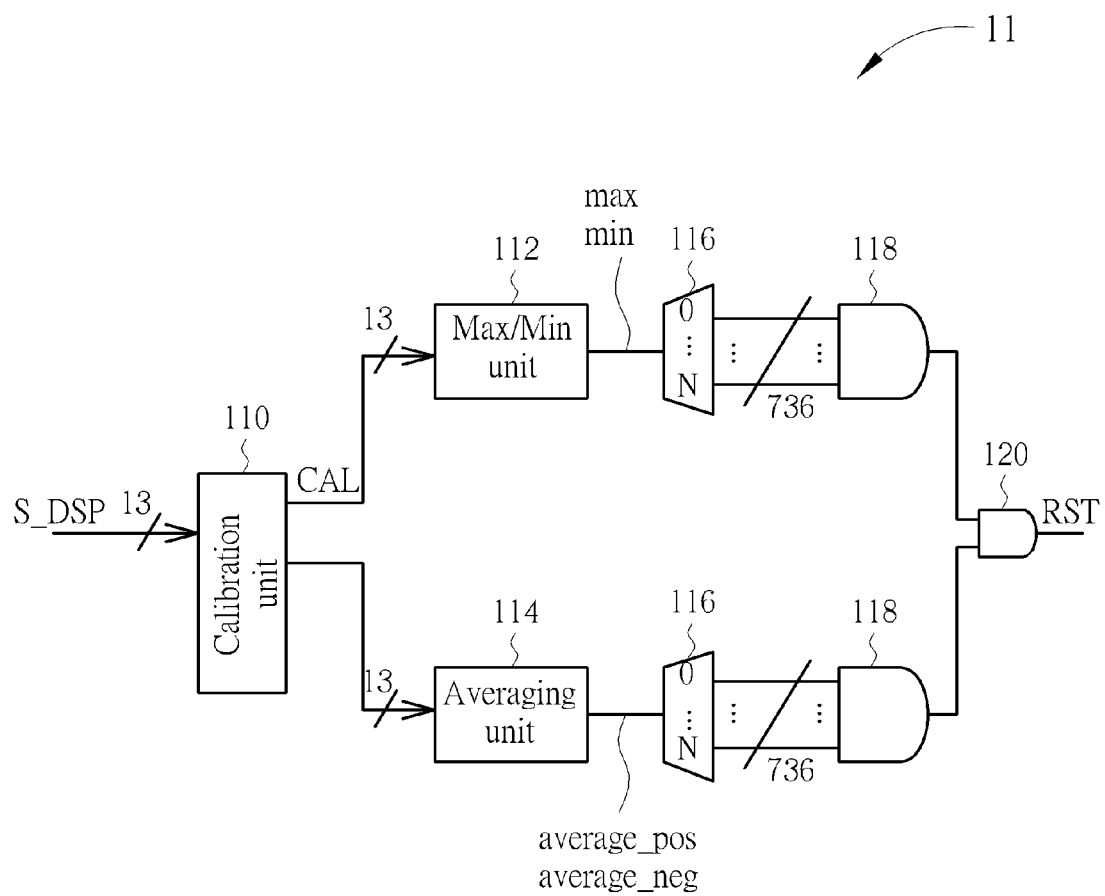
FIG. 10 shows a schematic diagram of the digital signal processing of an FPGA according to an example of the present invention.

The FPGA_C may include the high-speed parallel digital adder, multipliers, and dividers. Because of the nonlinear characteristic of the LCD, it requires to test whether the LCD driver IC pass the test or not, and to extract the maximum/minimum, and the average value. FIG. 10 shows the diagram of the digital signal processing procedure 11 of FPGA. The digital signal processing procedure 11 may be achieved by the FPGA_C of FIG. 9. In FIG. 10, a 6-bit single chip LCD driver IC is used as an example for the DUT. The digital signals BADC1 and BADC2 converted by the ADC 804 are firstly processed by FPGA_A and FPGA_B to generate the digital signal S_DSP. The digital signal S_DSP is transmitted to FPGA_C, using a calibration unit 110 to determine the gain and offset of the LCD output channels, and then compute the according maximum/minimum, and the average values of test signal SIG via a calibration unit 110. After the maximum/minimum, and the average value of every LCD channel are derived, a test result RST can be obtained via the processing of de-multiplexer 116 and logic gates 118 and 120. The test result RST is used to determine whether the DUT passes the test or not.

Figure 11:
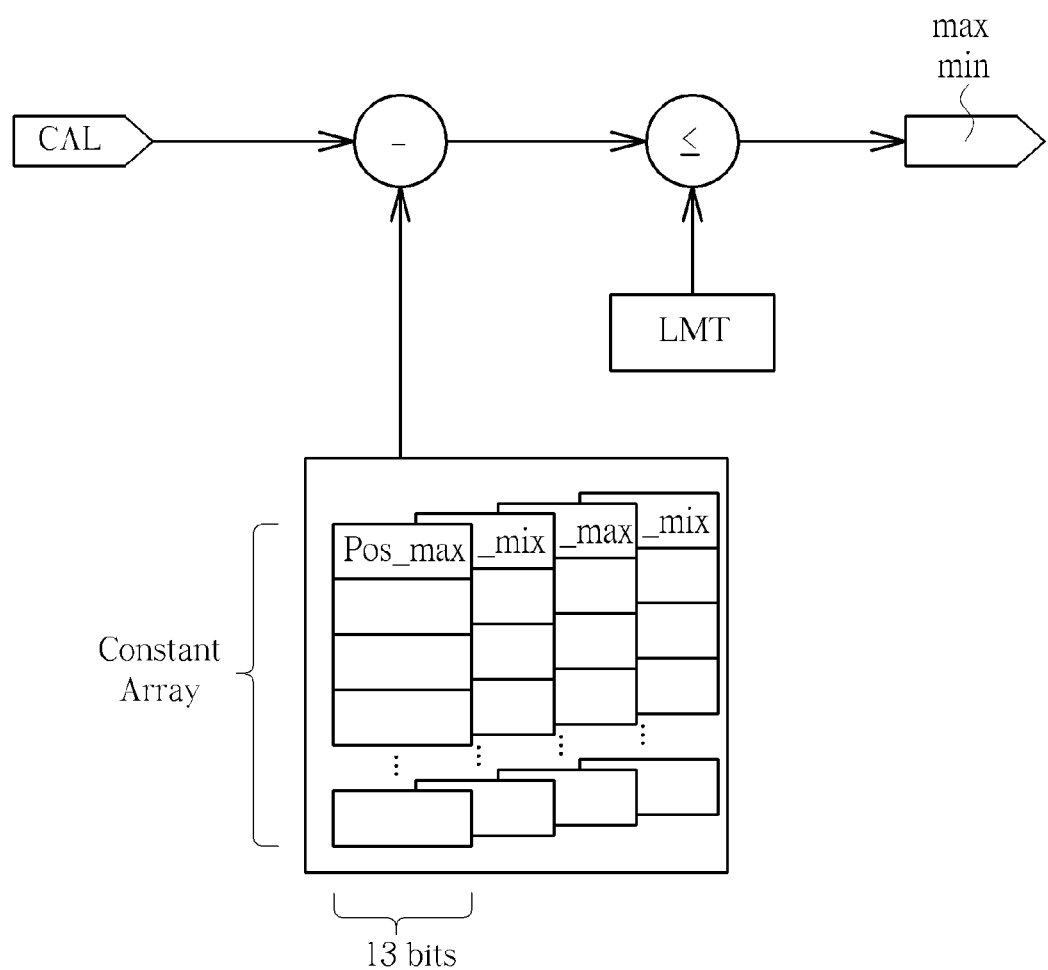
FIG. 11 is a diagram of maximum/minimum unit algorithm shown in FIG. 10.

FIG. 11 is the diagram of the algorithm of maximum/minimum unit 112 shown in FIG. 10. The HDL (Hardware description language) regarding the maximum/minimum computation is described below:

```
pos_dev_min<=ADC_output-Pos_min ;
pos_dev_max<=Pos_max-ADC_output;
neg_dev_min<=ADC_output-Neg_min ;
neg_dev_max<= Neg_max-ADC_output ;
if (pos_dev_min[MSB]  |  pos_dev_max[MSB]  |
neg_dev_min[MSB] | neg_dev_max[MSB])
    pass_fail=0;// fail
else
    pass_fail=1;//pass
```

Figure 12:
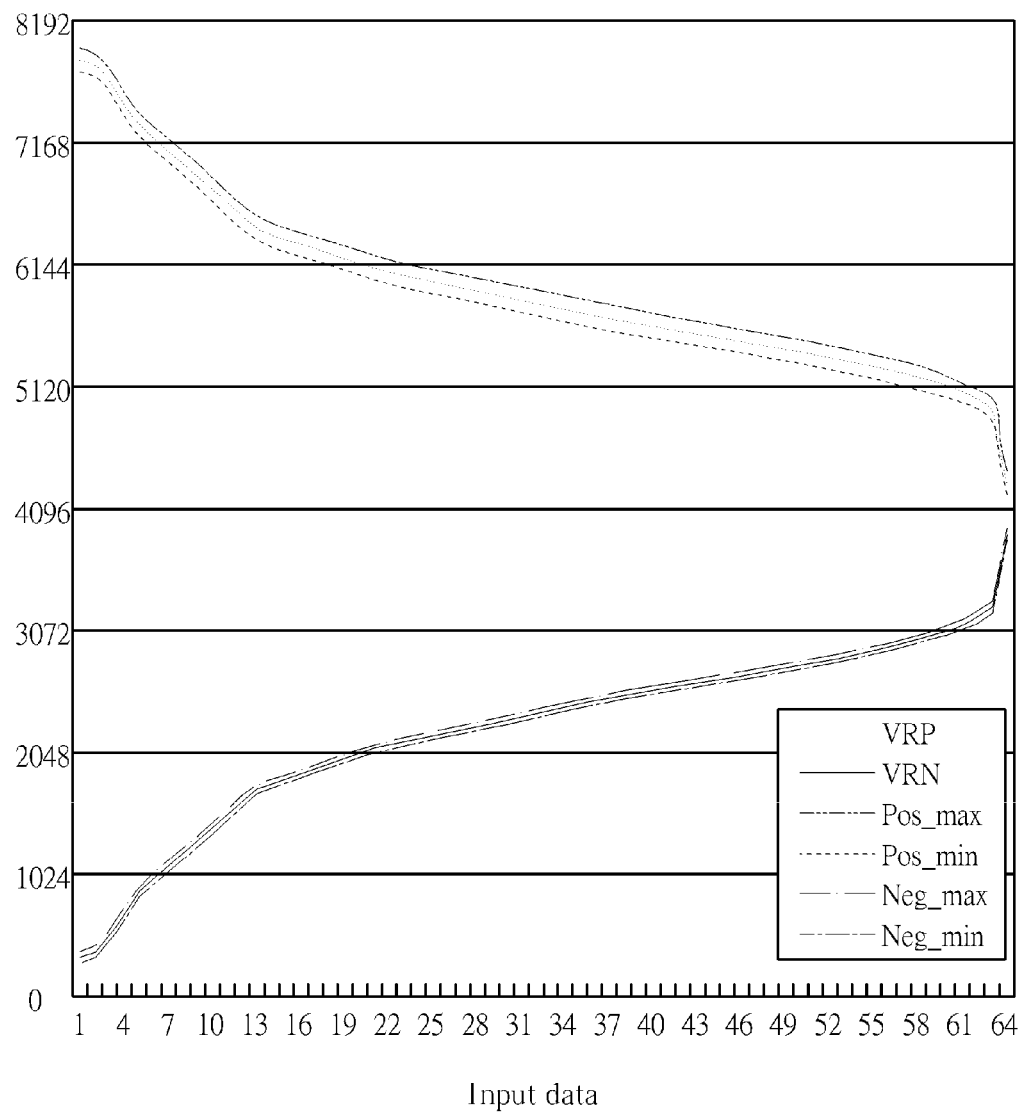
FIG. 12 shows a schematic diagram of an output voltage characteristic of the digital signal processing shown in FIG. 10.

The output voltage curve derived by above computation is shown in FIG. 12, wherein the VRP and VRN represent positive and negative 64 gray-scale output of the LCD driver IC. Pos_max and Pos_min represent the positive maximum and minimum boundaries, which are used for determining if the LCD driver IC is passed or not for positive output condition. Neg_max and Neg_min represent the negative maximum and minimum boundaries used for determining if the LCD driver IC is passed or not for negative output condition.

Figure 13:
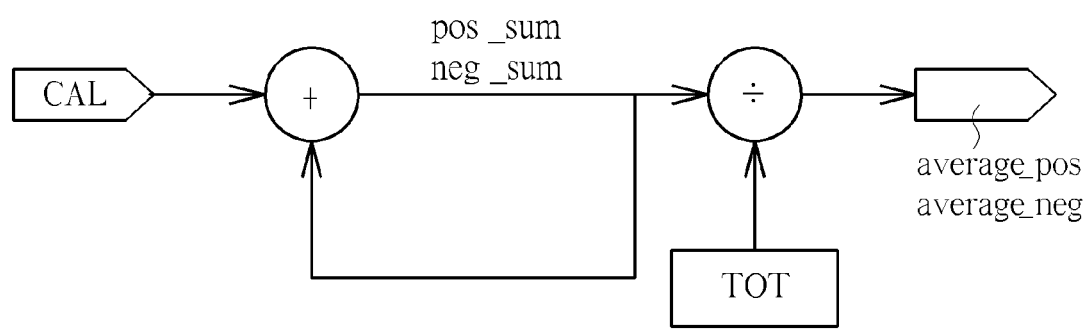
FIG. 13 shows a schematic diagram of algorithm of the average unit shown in FIG. 10.

FIG. 13 is the diagram of average unit 113 algorithm in FIG. 10. The HDL (Hardware description language) regarding the average computation is described below:

```
pos_sum<= ADC_output+ pos_sum;
neg_sum<= ADC_output+ neg_sum;
div18_5bit_adder_pos_avg (
    .denom    (368), // Total LCD output pins
    .numer    (pos_sum),
    .quotient (average_pos),
    .remain   (pos_avg_remain ));
div18_5bit_adder_neg_avg (
    .denom    (368), // Total LCD output pins
    .numer    (neg_sum),
    .quotient (average_neg),
    .remain   (neg_avg_remain ));
```

Because the OPAs and ADCs have the offset voltage, the maximum value of different ADC inputs may be corresponded to different digital output values. To reduce the zero offset error and gain error, it requires a calibration in FPGA first. As illustrated above, the calibration equation is represented by y=Mx+C. In order to obtain M value and C value, it requires to input the ideal values y2, y1 first, then to use the computation below to obtain the M value and C value.

$$M=(y2-y1)/(x2-x1); \quad (2)$$

$$C=y1; \quad (3)$$

x2 and x1 are the corresponding maximum and minimum values of the ideal values y2, y1 of ADC. In FPGA, y1 and x1 may be set as a fixed array. It requires to confirm if the M value is within the range between 0.9 and 1.1, and to confirm if the C value is within the range of +/−20LSB. According to the equation above, the FPGA requires a divider and a subtractor with a capability to support the positive/negative sign operation for accurately calculating the C value and proceeding with the calibration. Next, according to the equation (1), a multiplexer, an adder, and a subtractor may be used in the FPGA to obtain the calibrated output.

In an embodiment, the maximum value of LSB (Least significant bit) of the ADC is 7, and the actual offset error of the entire integrated circuit testing interface does not exceed 15 LSB. The ADC has 13 bits, and the full range is 8191. It requires 15 bit for storing the data, so the FPGA needs to setup 2 sets of 88,320 bytes (15 bits×64 scale×92ADC) RAM (Random-access memory). In another embodiment, FPGA may be designed to include the multiplexer, divider, adder, and subtractor in order to save the memories.

Figure 14:
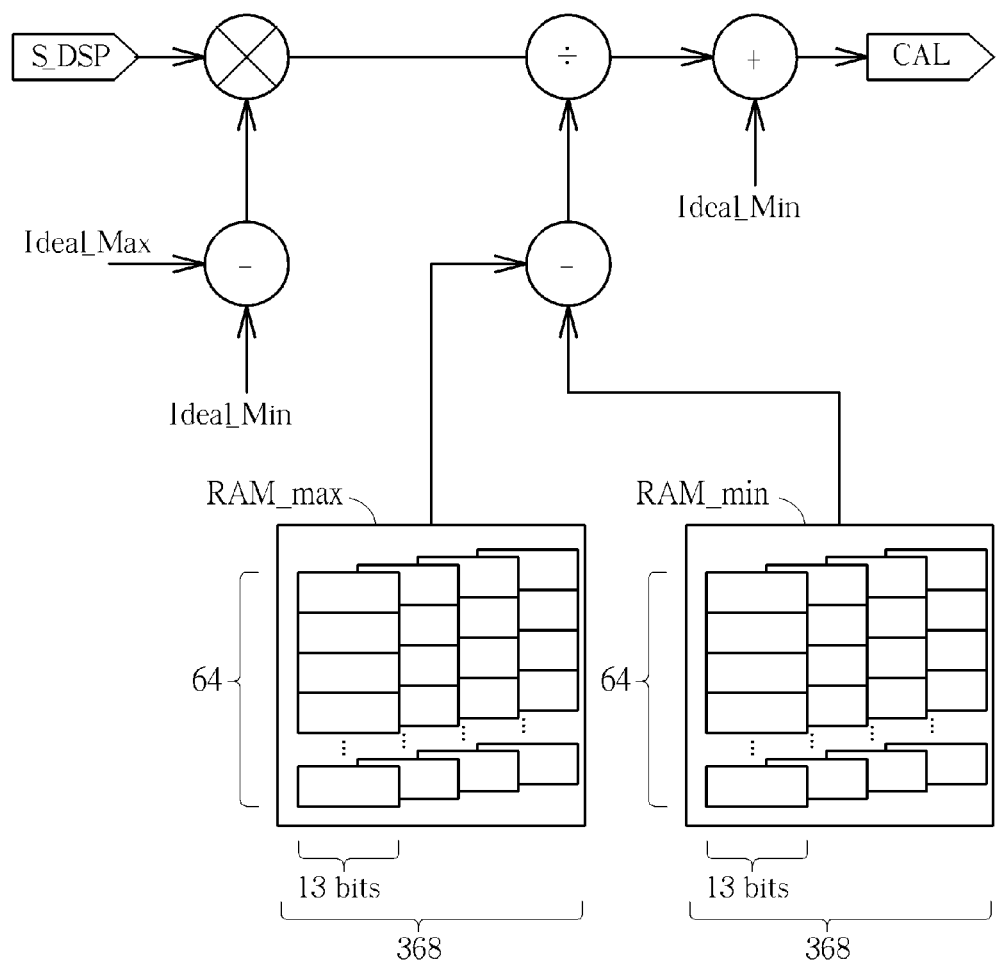
FIG. 14 shows a schematic diagram of algorithm of the calibration unit shown in FIG. 10.

FIG. 14 is the diagram of calibration unit 110 algorithm in FIG. 10. The HDL (Hardware description language) regarding the calibration is described below:

```
//y=(|(y2-y1)|*x)/|(x2-x1)| + y1;
Diff_x<=ADC_Max[i]- ADC_Min[i];// x2-x1
Diff_y<=ideal_Max[i]- ideal_Min[i];// y2-y1
Multi_y<=Diff_y*ADC_output;// (y2-y1)*x
divide27_megafunction divide27_megafunction (
    .denom    (Diff_x), // divisor
    .numer    (Multi_y), // dividend
    .quotient (cal_out1),
    .remain   (remainder));
Cal_out<= cal_out1+ ideal_Min[i];
```

Figure 15:
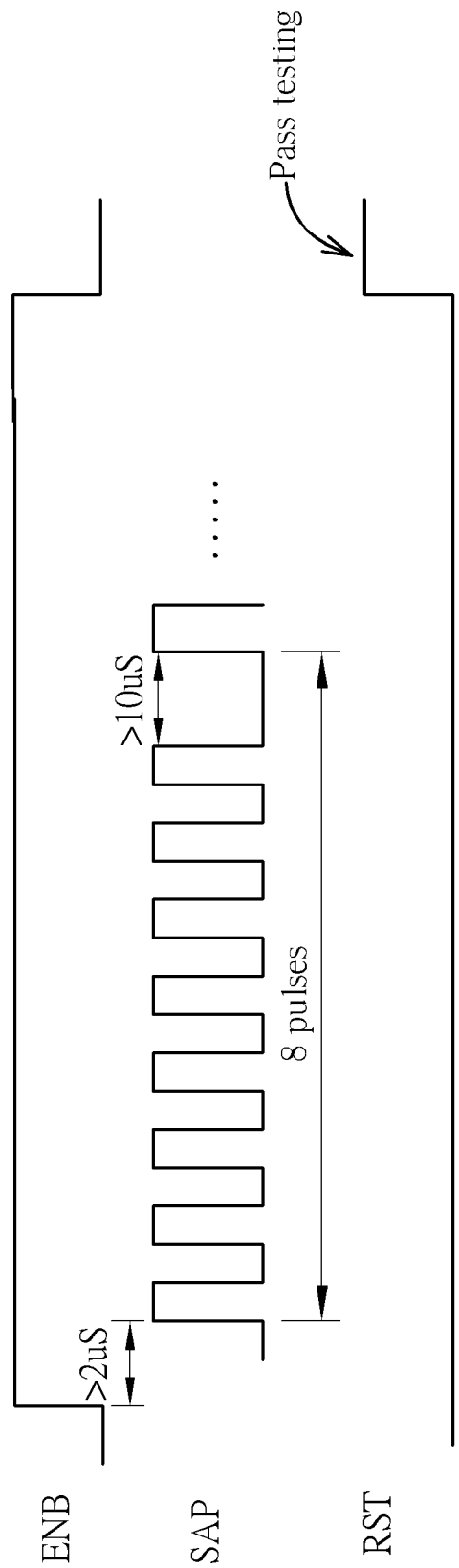
FIG. 15 is a schematic diagram of the signal timing chart of pins in the integrated circuit testing interface shown in FIG. 2.

In the testing operation, the tester may be set as a master controller while the integrated circuit testing interface is set as a slave. The tester as a master may control the sampling start time, number, and the stop time of the entire ATE via pins. The integrated circuit testing interface as a slave may proceed the test and computation according to the command come from the tester, and then output the test results (i.e. the DUT pass the test or not). In an embodiment, the communication between the tester and the integrated circuit testing interface may be done by three pins 212A, 212B, 212C as shown in FIG. 2. For example, the processing means of the integrated circuit testing interface (FPGA_C as mentioned above) has three I/O ports to connect the pins 212A, 212B, 212C. The signal timing chart is shown in FIG. 15. The first I/O port transmits the first test signal to the tester 200 of the ATE 20 via the pin 212A. The first test signal includes an enabling signal ENB to define the start or stop test, setup output test data to tester 200, or ground the output for reducing the noise; the second I/O port transmits the second test signal to the tester 200 of the ATE 20 via the pin 212B. The second test signal includes a sampling signal SAP to determine the sampling number, output the configured value of the tester 200, or ground the output for reducing the noise; the third I/O port transmits the third test signal to the tester 200 of the ATE 20 via the pin 212C. The third test signal includes a test result RST computed from the FPGA. While starting the test, the processing means of the integrated circuit testing interface sets the test result RST to 0; and after stopping the test, the DUT is considered passed if the test result is 1.

The abovementioned embodiments use 3 pins to distinguish the output data of processing means in the integrated circuit testing interface, but are not limited therein. In other embodiments, the pin number may be one or multiple to accommodate the communication requirements between the integrated circuit testing interface and the tester.

In addition to read the test result RST from the pin of the integrated circuit testing interface (e.g. the third pin 212C used for transmitting the test result RST), the test result may be combined with the original test raw data to transmit, via the serial bus, to the computing device 216 for storing or further analysis.

In summary, the integrated circuit testing interface of the present invention utilizes a plurality of digitizers and processing means to integrate the probe interface board, a load board, or a probe board, to proceed with conversion, sorting, offset calibration, or the computation processing outside the tester, such that the legacy ATE can be upgraded. In addition, the testing time can be significantly reduced by utilizing the integrated circuit testing interface of the present invention. Compared with the known ATE, i.e., the conventional ATE which supports testing the same DUT specifications, the ATE (Automatic Test Equipment) of the present invention has faster testing speed. Therefore, it can greatly reduce the testing cost and time, thereby increasing the product competitiveness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit (IC) testing interface, capable of upgrading an automatic test equipment (ATE) for testing a semiconductor device, the IC testing interface comprising:
   at least one pin, configured for receiving or transmitting at least one test signal to a tester of the automatic test equipment;
   a plurality of digitizers, coupled to the at least one pin for generating a digital signal;
   a processing means, coupled to the plurality of digitizers for processing the digital signal; and
   a connection unit, configured for connecting the processing means with a computing device for transmitting an output signal from the processing means to the computing device;
   wherein the IC testing interface is disposed between the tester and a prober of the automatic test equipment;
   wherein the at least one pin comprises:
      a first pin, configured for transmitting a first test signal of the at least one test signal to the tester of the ATE, wherein the first test signal comprises an enabling signal for reading or writing a testing datum;
      a second pin, configured for transmitting a second test signal of the at least one test signal to the tester of the ATE, wherein the second test signal comprises a sampling signal for determining a sampling number of the semiconductor device; and
      a third pin, configured for transmitting a third test signal of the at least one test signal to the tester of the ATE, wherein the third test signal comprises a testing result.

2. The IC testing interface of claim 1, wherein the processing means converts or sorts the digital signal, calibrates an offset of the digital signal, or takes an arithmetic operation on the digital signal.

3. The IC testing interface of claim 1, wherein the IC testing interface integrates a probe interface board, a load board, or a probe board so as to be installed in the ATE.

4. The IC testing interface of claim 1, wherein each of the plurality of digitizers comprises:
   an operational amplifier; and
   an analog to digital converter (ADC), coupled to the operational amplifier.

5. The IC testing interface of claim 1, wherein the processing means is a field-programmable gate array (FPGA), an application specific integrated circuit (ASIC), a microprocessor, or a micro-controller.

6. The IC testing interface of claim 1, wherein the IC testing interface is a replaceable interface.

7. The IC testing interface of claim 1, wherein the semiconductor device is a liquid crystal display driver IC.

8. The IC testing interface of claim 1, wherein the connection unit comprises a Universal Serial Bus (USB).

9. An automatic test equipment (ATE) for testing a semiconductor device, comprising:
   a tester;
   a prober, configured for carrying the semiconductor device;
   a probe card, coupled to the tester for probing the semiconductor device; and
   an integrated circuit (IC) testing interface, coupled to the tester and installed outside of the tester, the IC testing interface comprising:
      at least one pin, configured for receiving or transmitting at least one test signal to the tester;
      a plurality of digitizers, coupled to the at least one pin for generating a digital signal;
      a processing means, coupled to the plurality of digitizers for processing the digital signal; and
      a connection unit, configured for connecting the processing means with a computing device for transmitting an output signal from the processing means to the computing device;
   wherein the IC testing interface is disposed between the tester and the prober of the ATE;
   wherein the at least one pin comprises:
      a first pin, configured for transmitting a first test signal of the at least one test signal to the tester of the ATE, wherein the first test signal comprises an enabling signal for reading or writing a testing datum;
      a second pin, configured for transmitting a second test signal of the at least one test signal to the tester of the ATE, wherein the second test signal comprises a sampling signal for determining a sampling number of the semiconductor device; and
      a third pin, configured for transmitting a third test signal of the at least one test signal to the tester of the ATE, wherein the third test signal comprises a testing result.

10. The ATE of claim 9, wherein the processing means converts or sorts the digital signal, calibrates an offset of the digital signal, or takes an arithmetic operation on the digital signal.

11. The ATE of claim 9, wherein the IC testing interface integrates a probe interface board, a load board, or a probe board so as to be installed in the ATE.

12. The ATE of claim 9, wherein each of the plurality of digitizers comprises:
   an operational amplifier; and
   an analog to digital converter (ADC), coupled to the operational amplifier.

13. The ATE of claim 9, wherein the processing means is a field-programmable gate array (FPGA), an application specific integrated circuit (ASIC), a microprocessor, or a micro-controller.

14. The ATE of claim 9, wherein the IC testing interface is a replaceable interface.

15. The ATE of claim 9, wherein the semiconductor device is a liquid crystal display driver IC.

16. The IC testing interface of claim 9, wherein the connection unit comprises a Universal Serial Bus (USB).

* * * * *